(12) United States Patent
Chi et al.

(10) Patent No.: US 11,978,497 B2
(45) Date of Patent: *May 7, 2024

(54) DDR SDRAM SIGNAL CALIBRATION DEVICE AND METHOD

(71) Applicant: REALTEK SEMICONDUCTOR CORPORATION, Hsinchu (TW)

(72) Inventors: Kuo-Wei Chi, Hsinchu (TW); Chun-Chi Yu, Hsinchu (TW); Chih-Wei Chang, Hsinchu (TW); Ger-Chih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 196 days.

This patent is subject to a terminal disclaimer.

(21) Appl. No.: 17/528,208

(22) Filed: Nov. 17, 2021

(65) Prior Publication Data
US 2023/0154524 A1 May 18, 2023

(51) Int. Cl.
*G11C 7/22* (2006.01)
*G06F 3/06* (2006.01)
*G11C 7/10* (2006.01)
*G11C 11/4076* (2006.01)
*G11C 11/4093* (2006.01)
*G11C 29/50* (2006.01)

(52) U.S. Cl.
CPC ........ *G11C 11/4076* (2013.01); *G06F 3/0644* (2013.01); *G11C 7/1078* (2013.01); *G11C 7/222* (2013.01); *G11C 11/4093* (2013.01); *G11C 29/50012* (2013.01); *G11C 2207/2254* (2013.01)

(58) Field of Classification Search
CPC ... G11C 11/4076; G11C 7/1078; G11C 7/222; G11C 11/4093; G11C 2207/2254; G11C 7/04

See application file for complete search history.

(56) References Cited

U.S. PATENT DOCUMENTS

| 7,983,094 | B1 * | 7/2011 | Roge | G11C 7/22 365/194 |
| 8,423,813 | B2 * | 4/2013 | Huang | G06F 5/06 713/401 |
| 8,787,097 | B1 * | 7/2014 | Chong | G11C 7/1066 365/194 |

(Continued)

*Primary Examiner* — Mushfique Siddique
(74) *Attorney, Agent, or Firm* — WPAT, P.C

(57) ABSTRACT

Disclosed is a DDR SDRAM signal calibration device capable of adapting to the variation of voltage and/or temperature. The device includes: an enablement signal setting circuit configured to generate data strobe (DQS) enablement setting; a signal gating circuit configured to generate a DQS enablement setting signal and a DQS enablement signal according to the DQS enablement setting and then output a gated DQS signal according to the DQS enablement signal and a DQS signal; and a calibration circuit configured to generate a first delay signal according to the DQS enablement setting signal and generate a second delay signal according to the first delay signal, the calibration circuit further configured to generate a calibration signal according to the first and second delay signals and the DQS signal. The enablement signal setting circuit maintains or adjusts the DQS enablement setting according to the calibration signal.

20 Claims, 9 Drawing Sheets

(56) References Cited

U.S. PATENT DOCUMENTS

| | | | | |
|---|---|---|---|---|
| 8,929,162 B1 * | 1/2015 | Fender | ............... | G11C 7/1051 |
| | | | | 365/193 |
| 9,105,327 B2 | 8/2015 | Prakash et al. | | |
| 10,320,591 B2 | 6/2019 | Giovannini et al. | | |
| 10,978,118 B1 | 4/2021 | Yu et al. | | |
| 2014/0126310 A1 * | 5/2014 | Sheen | ............... | G11C 29/028 |
| | | | | 365/193 |
| 2016/0260465 A1 * | 9/2016 | Fung | ............... | G11C 7/1093 |

* cited by examiner

DDR SDRAM SIGNAL CALIBRATION DEVICE AND METHOD

BACKGROUND OF THE INVENTION

1. Field of the Invention

The present invention relates to a signal calibration device and method, especially to a DDR SDRAM signal calibration device and method capable of adapting to the variation of voltage and/or temperature.

2. Description of Related Art

Generally, when reading data of a Double Data Rate Synchronous Dynamic Random Access Memory (DDR SDRAM), the DDR SDRAM sends a data strobe (DQS) signal and a data (DQ) signal to a controller. The DQS signal includes a tristate, a preamble, and clocks in sequence. The tristate is the signal between a previous access operation and a current read operation; the preamble is used for reminding the controller of preparing to read the DQ signal according to the clocks; and the clocks follow the preamble. In order to have a sampling circuit properly sample the DQ signal according to the clocks of the DQS signal instead of the tristate of the DQS signal, the controller uses a duration of a data strobe enablement (DQS_EN) signal being at a specific level (e.g., high level) to include the start and end of the clocks of the DQS signal; preferably, the controller has the level of the DQS_EN signal change from an original level to the specific level at the middle position of the preamble of the DQS signal, and has the level of the DQS_EN signal return to the original level according to a read/write command received by the DDR SDRAM; accordingly, the duration of the DQS_EN signal being at the specific level can properly include the clocks of the DQS signal without including the tristate, and allows the sampling circuit to sample the DQ signal according to the right part of the DQS signal (i.e., the clocks of the DQS signal).

However, even though the position of the preamble of the DQS signal is found and used for correctly setting the timing of the level change of the DQS_EN signal, the position of the preamble will vary with the voltage and/or temperature. This is especially serious when reading data of a Low Power Double Data Rate Synchronous Dynamic Random Access Memory (LPDDR SDRAM) because the position variation of the preamble of the LPDDR SDRAM's DQS signal may exceed the length of this preamble; therefore, after the voltage and/or temperature change(s), the duration of the DQS_EN signal being at the specific level may not correctly include the clocks of the DQS signal so that the sampling circuit may sample the DQ signal too early according to a wrong trigger signal (e.g., the tristate) and obtain incorrect read data or the sampling circuit may sample the DQ signal too late and obtain incomplete read data.

In consideration of the aforementioned problems, Applicant provided a solution previously (U.S. patent Ser. No. 10/978,118). However, this solution may have the following problems:

(1) The solution samples a delay signal of a previous DQS_EN signal and thereby determines whether the DQS signal comes early. However, if the interval between the previous read operation for reading data of a DDR SDRAM and the current read operation for reading data of the DDR SDRAM is too long, the solution cannot sample the delay signal of the previous DQS_EN signal, and cannot determine whether the DQS signal comes early.

(2) The solution pulls up the level of the tristate of the DQS signal and then samples a delay signal of the DQS signal, so as to determine whether the DQS signal comes early. However, the high-level tristate of the DQS signal is subject to the influence of noise, and this makes the result of sampling the delay signal of the DQS signal unreliable.

SUMMARY OF THE INVENTION

An object of the present invention is to provide a DDR SDRAM signal calibration device and method capable of adapting to the variation of voltage and/or temperature.

An embodiment of the DDR SDRAM signal calibration device of the present invention includes an enablement signal setting circuit, a signal gating circuit, and a calibration circuit. The enablement signal setting circuit is configured to generate data strobe (DQS) enablement setting. The signal gating circuit is coupled to the enablement signal setting circuit, and configured to generate a DQS enablement setting signal and a DQS enablement signal according to the DQS enablement setting and then output a gated DQS signal according to the DQS enablement signal and a DQS signal. The calibration circuit is coupled to the enablement signal setting circuit and the signal gating circuit, and configured to generate a first delay signal according to the DQS enablement setting signal and then generate a second delay signal according to the first delay signal; the calibration circuit is further configured to output a calibration signal according to the first delay signal, the second delay signal, and the DQS signal. The enablement signal setting circuit maintains or adjusts the DQS enablement setting according to the calibration signal.

An embodiment of the DDR SDRAM signal calibration method of the present invention includes the following steps: generating a DQS enablement setting signal and a DQS enablement signal according to DQS enablement setting; outputting a gated DQS signal according to the DQS enablement signal and a DQS signal; generating a first delay signal according to the DQS enablement setting signal; generating a second delay signal according to the first delay signal; and outputting a calibration signal according to the first delay signal, the second delay signal, and the DQS signal, wherein the calibration signal is for maintaining or adjusting the DQS enablement setting.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a Double Data Rate Synchronous Dynamic Random Access Memory (DDR SDRAM) signal calibration device and method capable of adapting to the variation of voltage and/or temperature. This invention is particularly important for reading data of a Low Power Double Data Rate Synchronous Dynamic Random Access Memory (LPDDR SDRAM).

Figure 1:
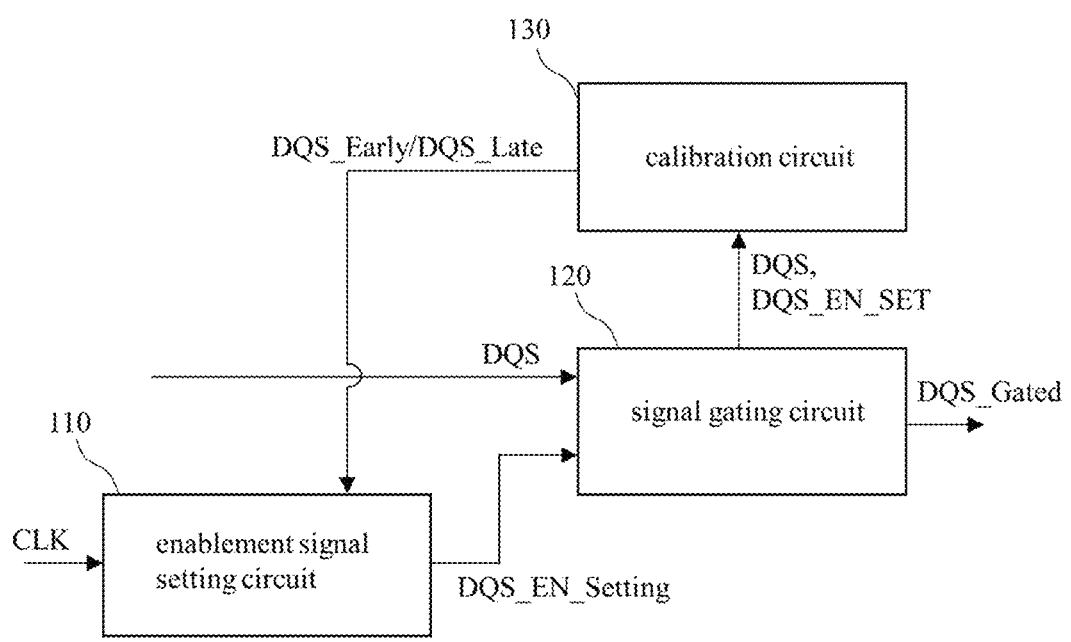
FIG. 1 shows an embodiment of the DDR SDRAM signal calibration device of the present invention.

FIG. 1 shows an embodiment of the DDR SDRAM signal calibration device of the present invention. The DDR SDRAM signal calibration device 100 of FIG. 1 includes an enablement signal setting circuit 110, a signal gating circuit 120, and a calibration circuit 130.

Please refer to FIG. 1. The enablement signal setting circuit 110 is configured to generate data strobe (DQS) enablement setting (DQS_EN_Setting) according to a reference clock (CLK). An embodiment of the enablement signal setting circuit 110 including a coarse tuning clock edge selector and a fine tuning delay chain controller is found in Applicant's U.S. patent application Ser. No. 16/177,603, but the present invention is not limited thereto.

Figure 2:
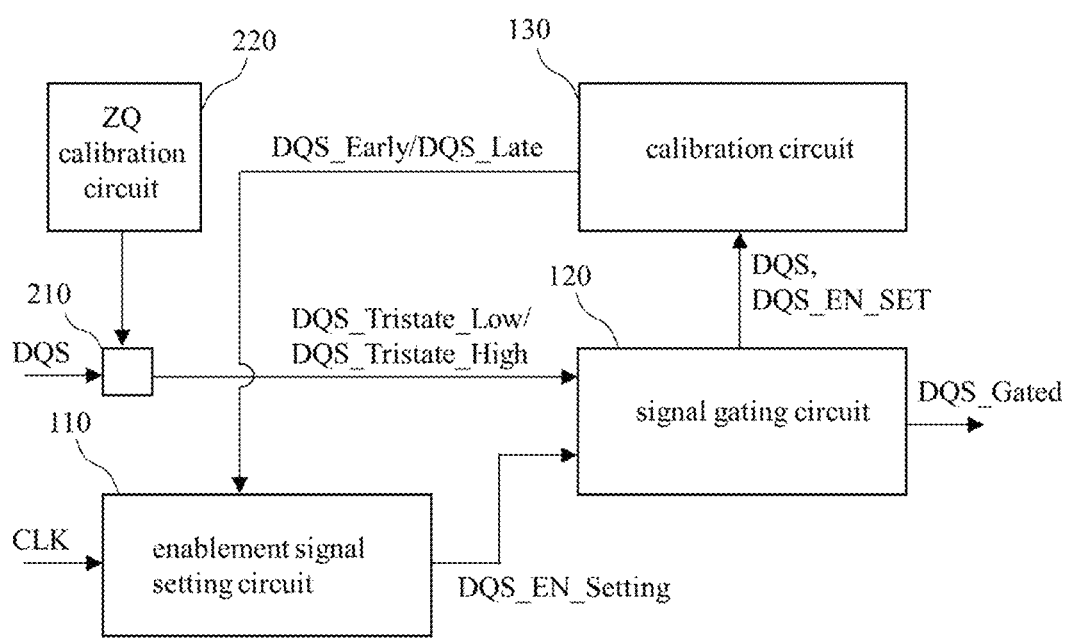
FIG. 2 shows the embodiment of FIG. 1 with a signal pad and a terminal impedance calibration circuit.

FIG. 2 shows that a signal pad 210 and a terminal impedance calibration circuit (ZQ calibration circuit) 220 can optionally be added to the embodiment of FIG. 1. As shown in FIG. 2, the signal pad 210 is configured to output a DQS signal (DQS). A conventional DQS signal includes a tristate, a preamble, and clocks as mentioned in the description of related art in this specification. The terminal impedance calibration circuit 220 is a known or self-developed circuit, and is capable of adjusting a signal level of the tristate of the DQS signal; for instance, the terminal impedance calibration circuit 220 can optionally pull down or pull up the signal level of the tristate of the DQS signal (DQS_Tristate_Low/DQS_Tristate_High).

Figure 5A:
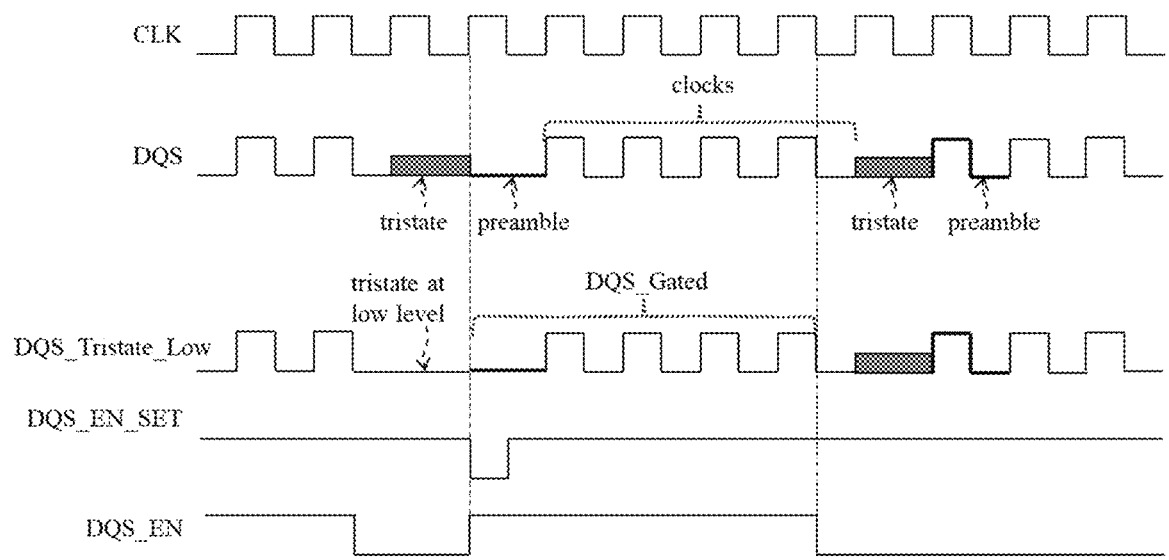
FIGS. 5*a*-5*c* shows timing diagrams illustrating signal relations when the tristate of the DQS signal is at a low level.

Please refer to FIG. 1. The signal gating circuit 120 is coupled to the enablement signal setting circuit 110, and the signal gating circuit 120 is configured to generate a DQS enablement setting signal (DQS_EN_SET) and a DQS enablement signal (DQS_EN) (as shown in FIG. 5a) according to the DQS enablement setting and then output a gated DQS signal (DQS_Gated) according to the DQS enablement signal and the DQS signal. For instance, the signal gating circuit 120 generates the DQS enablement setting signal according to the DQS enablement setting, then determines the timing of the DQS enablement signal changing from a low level to a high level according to the DQS enablement setting signal, and then performs a logical AND operation to the DQS enablement signal and the DQS signal in order to output the gated DQS signal. An embodiment of determining the timing of the DQS enablement signal changing from the low level to the high level and generating the gated DQS signal according to the DQS enablement signal is found in Applicant's U.S. patent application Ser. No. 16/177,603, but the present invention is not limited thereto.

Please refer to FIG. 1. The calibration circuit 130 is coupled to the enablement signal setting circuit 110 and the signal gating circuit 120, and configured to generate a first delay signal (DQS_EN_SET_D1) according to the DQS enablement setting signal and then generate a second delay signal (DQS_EN_SET_D1_delay) according to the first delay signal; the calibration circuit is further configured to output a calibration signal (DQS_Early/DQS_Late) according to the first delay signal, the second delay signal, and the DQS signal so that the enablement signal setting circuit can maintain or adjust the DQS enablement setting according to the calibration signal.

Figure 3:
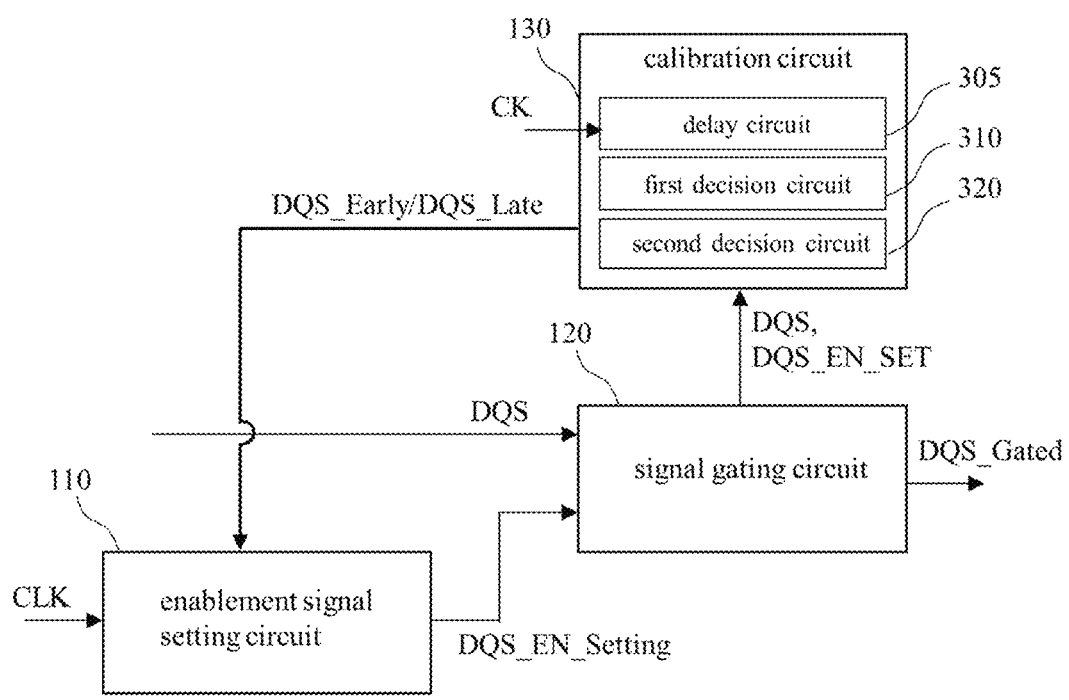
FIG. 3 shows an embodiment of the calibration circuit of FIG. 1.

In an exemplary implementation, the level of the tristate of the DQS signal is a first level (e.g., low level); the calibration circuit 130 is configured to generate a first calibration signal (DQS_Early) of the calibration signal according to the first delay signal and the DQS signal, and further configured to generate a second calibration signal (DQS_Late) of the calibration signal according to the second delay signal and the DQS signal; and the enablement signal setting circuit is configured to maintain or adjust the DQS enablement setting according to the first calibration signal and the second calibration signal. In this implementation, the calibration circuit 130 includes a delay circuit 305, a first decision circuit 310, and a second decision circuit 320 as shown in FIG. 3. The delay circuit 305 is configured to generate the first delay signal according to the DQS enablement setting signal and a clock signal (CK). The first decision circuit 310 is configured to generate the first calibration signal according to the first delay signal and the DQS signal. The second decision circuit 320 is configured to generate the second calibration signal according to the second delay signal and the DQS signal. An embodiment of the clock signal (CK) is the aforementioned reference clock (CLK).

Figure 4:
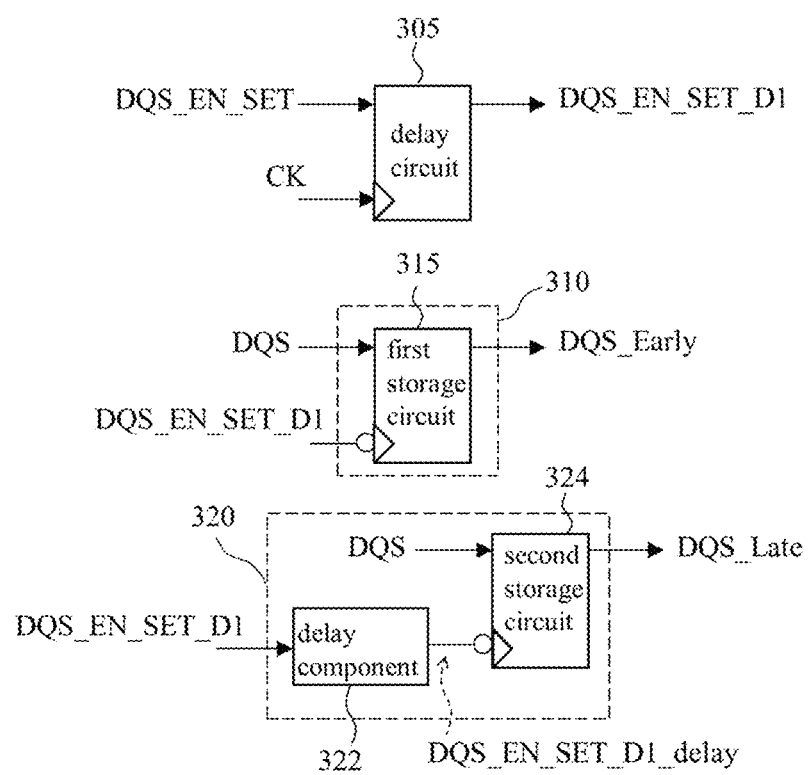
FIG. 4 shows an embodiment of the delay circuit, the first decision circuit, and the second decision circuit of FIG. 3.

FIG. 4 shows an embodiment of the delay circuit 305, the first decision circuit 310, and the second decision circuit 320 of FIG. 3. As shown in FIG. 4, the delay circuit 305 (e.g., a known D-type flip-flop) is configured to generate the first delay signal according to the DQS enablement setting signal and the clock signal; in this embodiment, the delay circuit 305 delays the DQS enablement setting signal for X times the cycle of the clock signal, wherein the X is between 0.5 and 1 or determined according to the demand for implementation. The first decision circuit 310 is configured to generate the first calibration signal according to the first delay signal and the DQS signal; in this embodiment, the first decision circuit 310 includes a first storage circuit 315 (e.g., D-type flip-flop; DFF) which is configured to sample and output the DQS signal as the first calibration signal according to the trigger of an inverted signal of the first delay signal. The second decision circuit 320 is configured to generate the second calibration signal according to the second delay signal and the DQS signal; in this embodiment, the second decision circuit 320 includes a delay component 322 and a second storage circuit 325 (e.g., D-type flip-flop; DFF), wherein the delay component 322 is configured to generate the second delay signal according to the first delay signal, and the second storage circuit 325 is configured to sample and output the DQS signal as the second calibration signal according to the trigger of an inverted signal of the second delay signal. In FIG. 4, the circular symbol (i.e., ○) denotes an inversion operation to a signal, and this symbol is commonly used in this technical field.

Please refer to FIGS. 1-4. In an exemplary implementation, when the level of the first calibration signal is a first predetermined level (e.g., high level), it implies that the first decision circuit 310 sampled the high level of one of the clocks of the DQS signal and the phase of the DQS signal takes the lead, and thus the enablement signal setting circuit 110 adjusts the DQS enablement setting according to the first calibration signal in order to advance the time point of the DQS enablement signal changing from an original level to a specific level (e.g., high level as shown in FIG. 5a); and when the level of the second calibration signal is a second predetermined level (e.g., low level), it implies that the second decision circuit 320 may sample the tristate of the DQS signal and the phase of the DQS signal falls behind, and thus the enablement signal setting circuit 110 adjusts the DQS enablement setting according to the second calibration signal in order to defer the time point of the DQS enablement signal changing from the original level to the specific level. It should be noted that the first predetermined level can be different from or the same as the second predetermined level in accordance with the demand for implementation.

Please refer to FIGS. 1-4. In an exemplary implementation, if the enablement signal setting circuit 110 adjusts the DQS enablement setting according to the first calibration signal indicating the phase of the DQS signal taking the lead, the signal gating circuit 120 advances the DQS enablement signal for a first change amount (e.g., one half of the preamble of the DQS signal) according to the DQS enablement setting, in which the first change amount is between one and three quarters of a length of the preamble of the DQS signal; and if the enablement signal setting circuit 110 adjusts the DQS enablement setting according to the second calibration signal indicating the phase of the DQS signal falling behind, the signal gating circuit 120 delays the DQS enablement signal for a second change amount (e.g., one half of the preamble of the DQS signal) according to the DQS enablement setting, in which the second change amount is between one and three quarters of the length of the preamble of the DQS signal. In an exemplary implementation, the delay component 322 causes a delay amount (e.g., one quarter of the preamble of the DQS signal) that is between one eighth and one half of a length of a preamble of the DQS signal. It should be noted that each of the above-mentioned first change amount, the second change amount, and the delay amount can be determined by those of ordinary skill in the art according to their demand for implementation.

FIG. 5a shows an exemplary timing diagram illustrating the ideal/initial signal relation between the following signals: the reference clock (CLK), the DQS signal (DQS), the DQS signal including the tristate at a low level (DQS_Tristate_Low), the DQS enablement setting signal (DQS_EN_SET), and the DQS enablement signal (DQS_EN). In FIG. 5a, it is shown that the tristate and preamble of the DQS signal is treated as a longer preamble, the level change position of the DQS enablement setting signal is aligned with a predetermined position (e.g., the middle) of the longer preamble, and the DQS enablement signal (DQS_EN) is pulled up as the DQS enablement setting signal is pulled down. It should be noted that the DQS enablement signal determines a DQS enablement period, and the cycle of the clocks of the DQS signal in the DQS enablement period is equal to the cycle of the reference clock.

Figure 5B:
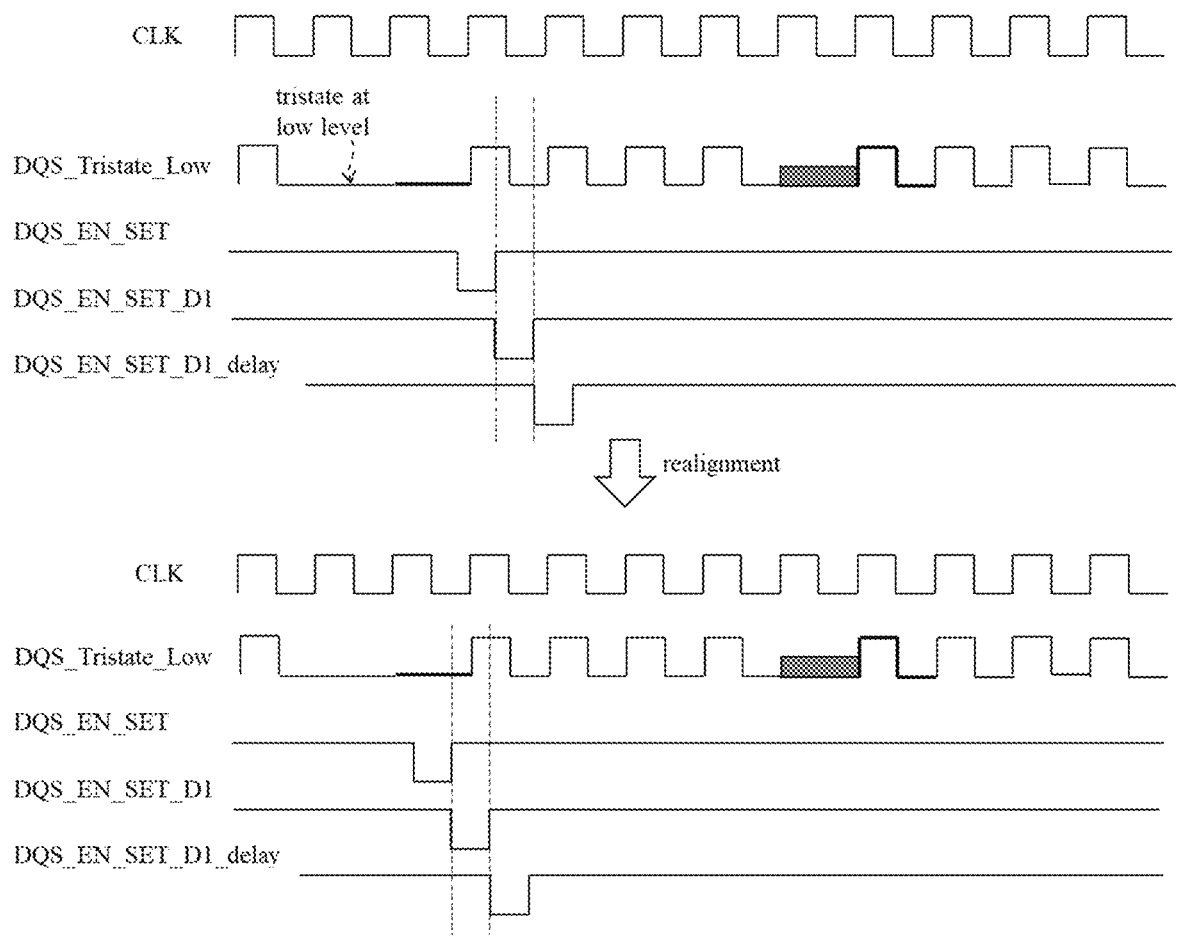

FIG. 5b shows an exemplary timing diagram illustrating the signal relation between the following signals after the variation of voltage and/or temperature: the DQS signal including the tristate at a low level (DQS_Tristate_Low), the DQS enablement setting signal (DQS_EN_SET), the first delay signal (DQS_EN_SET_D1), and the second delay signal (DQS_EN_SET_D1_delay). In FIG. 5b, it is shown that the DQS signal (DQS_Tristate_Low) is early due to the influence of voltage and/or temperature and thus the first decision circuit 310 of FIG. 4 samples the high level of one of the clocks of the DQS signal and outputs the sampled signal as the first calibration signal according to the trigger of the inverted signal of the first delay signal (DQS_EN_SET_D1); as a result, the first calibration signal (DQS_Early) is at the high level, consequently the DQS enablement setting signal (DQS_EN_SET) should be advanced to be realigned with the DQS signal (DQS_Tristate_Low), and this advancing operation is executed by the enablement signal setting circuit 110 according to the first calibration signal and executed by the signal gating circuit 120 according to the updated DQS enablement setting. FIG. 5b also shows an exemplary timing diagram illustrating the signal relation after the realignment, wherein the level change position of the DQS enablement setting signal is substantially/approximately realigned with the aforementioned predetermined position (e.g., the middle) of the longer preamble of the DQS signal.

Figure 5C:
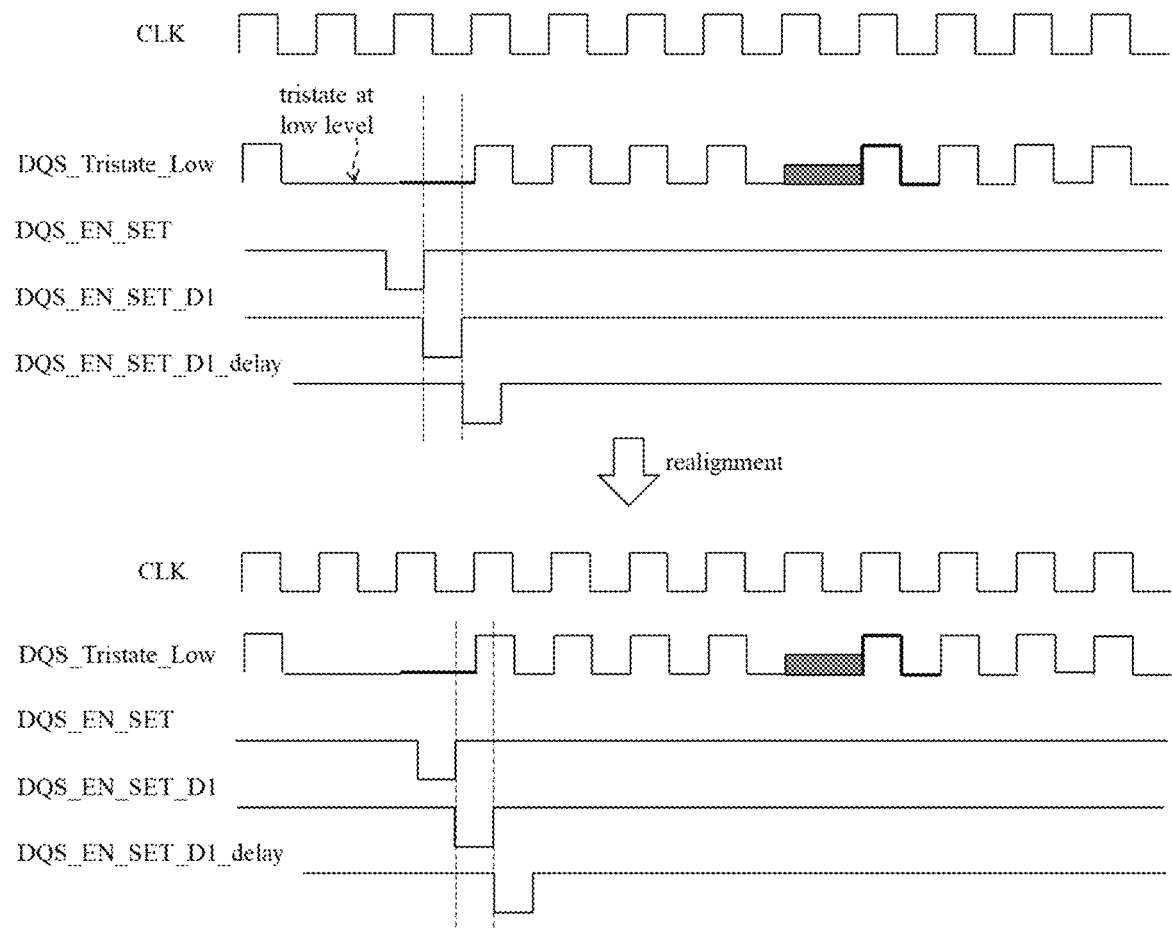

FIG. 5c shows an exemplary timing diagram illustrating the signal relation between the following signals after the variation of voltage and/or temperature: the DQS signal including the tristate at a low level (DQS_Tristate_Low), the DQS enablement setting signal (DQS_EN_SET), the first delay signal (DQS_EN_SET_D1), and the second delay signal (DQS_EN_SET_D1_delay). In FIG. 5c, it is shown that the DQS signal (DQS_Tristate_Low) is late due to the influence of voltage and/or temperature and thus the second decision circuit 320 of FIG. 4 samples the low level of the preamble of the DQS signal and outputs the sampled signal as the second calibration signal according to the trigger of the inverted signal of the second delay signal (DQS_EN_SET_D1_delay); as a result, the second calibration signal (DQS_Late) is at the low level, consequently the DQS enablement setting signal (DQS_EN_SET) should be delayed to be realigned with the DQS signal (DQS_Tristate_Low), and this delay operation is executed by the enablement signal setting circuit 110 according to the second calibration signal and executed by the signal gating circuit 120 according to the updated DQS enablement setting. FIG. 5c also shows an exemplary timing diagram illustrating the signal relation after the realignment, wherein the level change position of the DQS enablement setting signal (DQS_EN_SET) is substantially/approximately realigned with the aforementioned predetermined position (e.g., the middle) of the longer preamble of the DQS signal.

Figure 6:
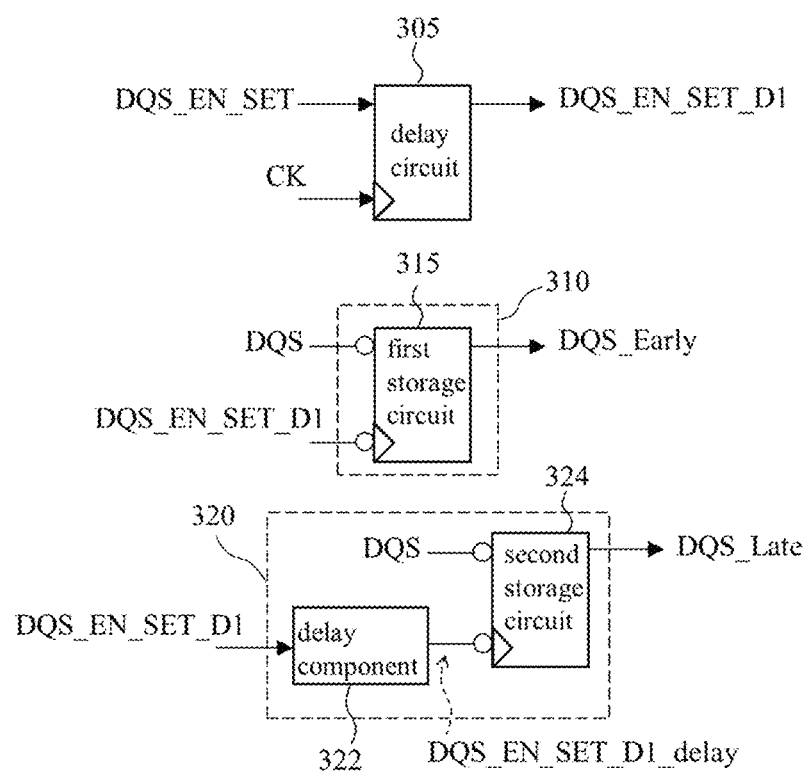
FIG. 6 shows another embodiment of the calibration circuit of FIG. 1.

It should be noted that for a memory specification (e.g., DDR4) defining a DQS signal with a high-level tristate, the present invention is still applicable by means of the calibration circuit 130 of FIG. 1 making decisions according to an inverted signal of the DQS signal as shown in FIG. 6. Since those having ordinary skill in the art can appreciate the detail and modification of FIG. 6 according to the description of FIGS. 1-5c, repeated and redundant description is omitted here.

Figure 7:
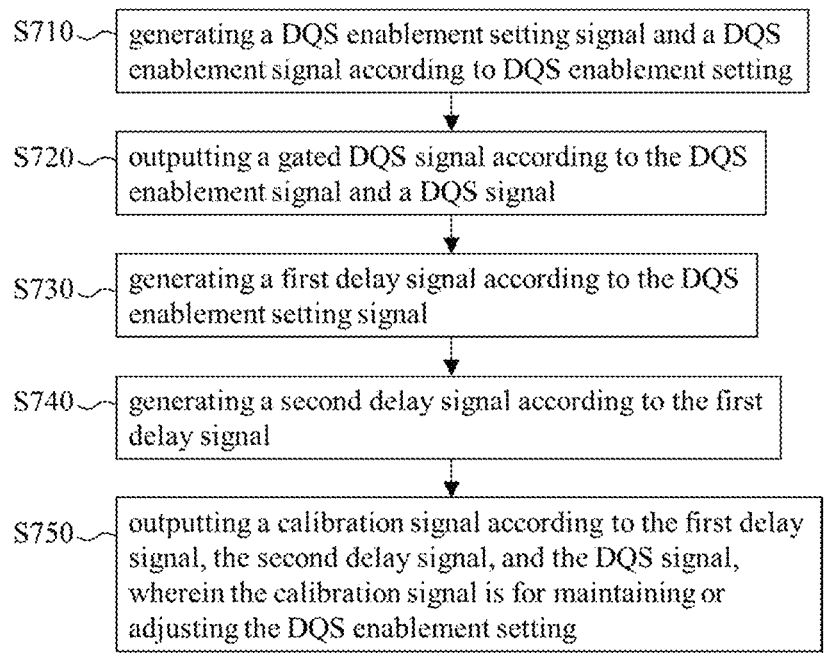
FIG. 7 shows an embodiment of the DDR SDRAM signal calibration method of the present invention.

FIG. 7 shows an embodiment of the DDR SDRAM signal calibration method of the present invention including the following steps:
S710: generating a DQS enablement setting signal and a DQS enablement signal according to DQS enablement setting. This step can be executed by the signal gating circuit 120 of FIG. 1.
S720: outputting a gated DQS signal according to the DQS enablement signal and a DQS signal. This step can be executed by the signal gating circuit 120 of FIG. 1.
S730: generating a first delay signal according to the DQS enablement setting signal. This step can be executed by the calibration circuit 130 of FIG. 1.

S740: generating a second delay signal according to the first delay signal. This step can be executed by the calibration circuit 130 of FIG. 1.

S750: outputting a calibration signal according to the first delay signal, the second delay signal, and the DQS signal, wherein the calibration signal is for maintaining or adjusting the DQS enablement setting. This step can be executed by the calibration circuit 130 of FIG. 1.

Since those of ordinary skill in the art can appreciate the detail and the modification of the embodiment of FIG. 7 by referring to the disclosure of the embodiments of FIGS. 1-6, repeated and redundant description is omitted here.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the DDR SDRAM signal calibration device and method of the present invention can adapt to the variation of voltage and/or temperature in an uncomplicated and cost-effective way.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A device comprising:
   an enablement signal setting circuit configured to generate data strobe (DQS) enablement setting;
   a signal gating circuit coupled to the enablement signal setting circuit, the signal gating circuit configured to generate a DQS enablement setting signal and a DQS enablement signal according to the DQS enablement setting, and the signal gating circuit further configured to output a gated DQS signal according to the DQS enablement signal and a DQS signal; and
   a calibration circuit coupled to the enablement signal setting circuit and the signal gating circuit, the calibration circuit configured to generate a first delay signal according to the DQS enablement setting signal and then generate a second delay signal according to the first delay signal, the calibration circuit further configured to output a calibration signal according to the first delay signal, the second delay signal, and the DQS signal,
   wherein the enablement signal setting circuit receives the calibration signal and thereby maintains or adjusts the DQS enablement setting according to the calibration signal.

2. The device of claim 1, wherein a signal level of a tristate of the DQS signal is a low level.

3. The device of claim 2, wherein the calibration circuit is configured to generate a first calibration signal of the calibration signal according to the first delay signal and the DQS signal, and further configured to generate a second calibration signal of the calibration signal according to the second delay signal and the DQS signal; and the enablement signal setting circuit maintains or adjusts the DQS enablement setting according to the first calibration signal and the second calibration signal.

4. The device of claim 3, wherein when a level of the first calibration signal is a first predetermined level, the enablement signal setting circuit adjusts the DQS enablement setting according to the first calibration signal; when a level of the second calibration signal is a second predetermined level, the enablement signal setting circuit adjusts the DQS enablement setting according to the second calibration signal; and the first predetermined level is different from the second predetermined level.

5. The device of claim 3, wherein if the enablement signal setting circuit adjusts the DQS enablement setting according to the first calibration signal, the signal gating circuit advances the DQS enablement signal for a first change amount according to the DQS enablement setting, in which the first change amount is between one and three quarters of a length of a preamble of the DQS signal; and if the enablement signal setting circuit adjusts the DQS enablement setting according to the second calibration signal, the signal gating circuit delays the DQS enablement signal for a second change amount according to the DQS enablement setting, in which the second change amount is between one and three quarters of the length of the preamble of the DQS signal.

6. The device of claim 3, wherein the calibration circuit includes:
   a delay circuit configured to generate the first delay signal according to the DQS enablement setting signal and a clock signal;
   a first decision circuit configured to generate the first calibration signal according to the first delay signal and the DQS signal; and
   a second decision circuit configured to generate the second calibration signal according to the second delay signal and the DQS signal.

7. The device of claim 6, wherein the delay circuit includes a flip-flop, and the flip-flop is configured to receive the DQS enablement setting signal and output the first delay signal according to a clock signal.

8. The device of claim 6, wherein the DQS enablement signal determines a DQS enablement period; in the DQS enablement period a cycle of clocks of the DQS signal is a first cycle; and the first cycle is equal to a cycle of the clock signal.

9. The device of claim 6, wherein:
   the first decision circuit includes a first storage circuit configured to sample and output the DQS signal as the first calibration signal in accordance with a trigger of an inversion signal of the first delay signal; and
   the second decision circuit includes a delay component and a second storage circuit, the delay component configured to generate the second delay signal according to the first delay signal, and the second storage circuit configured to sample and output the DQS signal as the second calibration signal in accordance with a trigger of an inversion signal of the second delay signal.

10. The device of claim 1, wherein a signal level of a tristate of the DQS signal is a high level.

11. The device of claim 10, wherein the calibration circuit is configured to generate a first calibration signal of the calibration signal according to the first delay signal and an inversion signal of the DQS signal, and further configured to generate a second calibration signal of the calibration signal according to the second delay signal and the inversion signal of the DQS signal; and the enablement signal setting circuit maintains or adjusts the DQS enablement setting according to the first calibration signal and the second calibration signal.

12. The device of claim 11, wherein when a level of the first calibration signal is a first predetermined level, the enablement signal setting circuit adjusts the DQS enablement setting according to the first calibration signal; when a level of the second calibration signal is a second predetermined level, the enablement signal setting circuit adjusts the DQS enablement setting according to the second calibration signal; and the first predetermined level is different from the second predetermined level.

13. The device of claim 11, wherein if the enablement signal setting circuit adjusts the DQS enablement setting according to the first calibration signal, the signal gating circuit advances the DQS enablement signal for a first change amount according to the DQS enablement setting, in which the first change amount is between one and three quarters of a length of a preamble of the DQS signal; and if the enablement signal setting circuit adjusts the DQS enablement setting according to the second calibration signal, the signal gating circuit delays the DQS enablement signal for a second change amount according to the DQS enablement setting, in which the second change amount is between one and three quarters of the length of the preamble of the DQS signal.

14. The device of claim 11, wherein the calibration circuit includes:
   a delay circuit configured to generate the first delay signal according to the DQS enablement setting signal and a clock signal;
   a first decision circuit configured to generate the first calibration signal according to the first delay signal and the DQS signal; and
   a second decision circuit configured to generate the second calibration signal according to the second delay signal and the DQS signal.

15. The device of claim 14, wherein the delay circuit includes a flip-flop, and the flip-flop is configured to receive the DQS enablement setting signal and output the first delay signal according to a clock signal.

16. The device of claim 14, wherein the DQS enablement signal determines a DQS enablement period; in the DQS enablement period a cycle of clocks of the DQS signal is a first cycle; and the first cycle is equal to a cycle of the clock signal.

17. The device of claim 14, wherein:
   the first decision circuit includes a first storage circuit configured to sample and output the DQS signal as the first calibration signal in accordance with a trigger of an inversion signal of the first delay signal; and
   the second decision circuit includes a delay component and a second storage circuit, the delay component configured to generate the second delay signal according to the first delay signal, and the second storage circuit configured to sample and output the DQS signal as the second calibration signal in accordance with a trigger of an inversion signal of the second delay signal.

18. A method comprising:
   generating a DQS enablement setting signal and a DQS enablement signal according to DQS enablement setting;
   outputting a gated DQS signal according to the DQS enablement signal and a DQS signal; and
   generating a first delay signal according to the DQS enablement setting signal;
   generating a second delay signal according to the first delay signal; and
   outputting a calibration signal according to the first delay signal, the second delay signal, and the DQS signal,
   wherein the calibration signal is transmitted to a circuit used for generating the DQS enablement setting, and then the calibration signal is used by the circuit to maintain or adjust the DQS enablement setting.

19. The method of claim 18, wherein the step for generating the calibration signal includes:
   generating a first calibration signal of the calibration signal according to the first delay signal and the DQS signal; and generating a second calibration signal of the calibration signal according to the second delay signal and the DQS signal.

20. The method of claim 18, wherein the step for generating the calibration signal includes:
   generating a first calibration signal of the calibration signal according to the first delay signal and an inversion signal of the DQS signal; and generating a second calibration signal of the calibration signal according to the second delay signal and the inversion signal of the DQS signal.

* * * * *